United States Patent

White

[15] 3,701,033

[45] Oct. 24, 1972

[54] BROADBAND AMPLIFIER HAVING IMPROVED GAIN CHARACTERISTICS

[72] Inventor: Gerard White, Marlboro, N.J.

[73] Assignee: Bell Telephone Laboratories, Incorporated, Murray Hill, N.J.

[22] Filed: Dec. 2, 1970

[21] Appl. No.: 94,451

[52] U.S. Cl. .......................................330/21, 330/31

[51] Int. Cl. ................................................H03f 3/04

[58] Field of Search.................330/18, 21, 31, 32, 94

[56] References Cited

UNITED STATES PATENTS 2,559,888 7/1951 Makepeace..............330/94 X 3,407,360 10/1968 Buhr........................330/94 X 3,461,393 8/1969 Webb ......................330/18 X

*Primary Examiner*—Roy Lake

*Assistant Examiner*—Lawrence J. Dahl

*Attorney*—R. J. Guenther and Kenneth B. Hamlin

[57] ABSTRACT

A broadband amplifier including a high-frequency amplifier embedded in a low-frequency circuit is described. The broadband amplifier is characterized by a flat gain response from direct current (d.c.) to the high-frequency cutoff of the unmodified high-frequency amplifier configuration. Further, the broadband amplifier provides this low- and high-frequency gain without compromise to the high-frequency response characteristic of prior art circuits.

5 Claims, 6 Drawing Figures

INVENTOR
G. WHITE
BY Lucian C. Canepa
ATTORNEY

BROADBAND AMPLIFIER HAVING IMPROVED GAIN CHARACTERISTICS

BACKGROUND AND PRIOR ART

This invention relates to improved broadband electronic amplifiers.

It is desirable in a broad range of electronic circuit applications to provide for the amplification of wideband signals. In particular, it is often desirable to provide for the amplification of signals having high-frequency and low-frequency components.

Many prior art circuits have been developed for providing amplification over a band of frequencies which may extend over a considerable range. It has been found difficult in the prior art, however, to provide amplification for signals extending from d.c. to several megahertz or more. This type of amplification is particularly difficult to realize when it is also necessary that the gain of the amplifier be essentially uniform over its entire range of operation.

It is therefore an object of the present invention to provide for an amplifier having substantially uniform gain over a range of frequencies extending from d.c. to a high-frequency region.

It is another object of the present invention to provide for a smooth transition from amplification at relatively low frequencies to that at relatively high frequencies.

SUMMARY OF THE INVENTION

These and other objects of the present invention are realized in a preferred embodiment comprising a modified version of a well-known high-frequency transistor amplifier. Modifications effected in accordance with the present invention include the addition of a number of passive circuit elements arranged to supplement circuit paths already included in the basic arrangement. These added elements provide a low-frequency path for signals being amplified while maintaining gain at an acceptable, substantially constant, level. Parameter values for the original and added circuit elements are chosen in accordance with prescribed relationships discussed in detail below.

It is therefore a feature of the present invention that auxiliary circuit means are provided in a high-frequency amplifier for introducing a low-frequency signal carrying path thereto.

It is another feature of the present invention that a selection of circuit parameter values in accordance with a prescribed optimum relationship be provided.

It is another feature of the present invention that an amplifier having substantially uniform gain over a wide range of frequencies be provided.

BRIEF DESCRIPTION OF THE DRAWING

These and other objects and features of the present invention will become more apparent after considering the detailed description provided below in connection with the appended drawing wherein.

DETAILED DESCRIPTION

Figure 1:
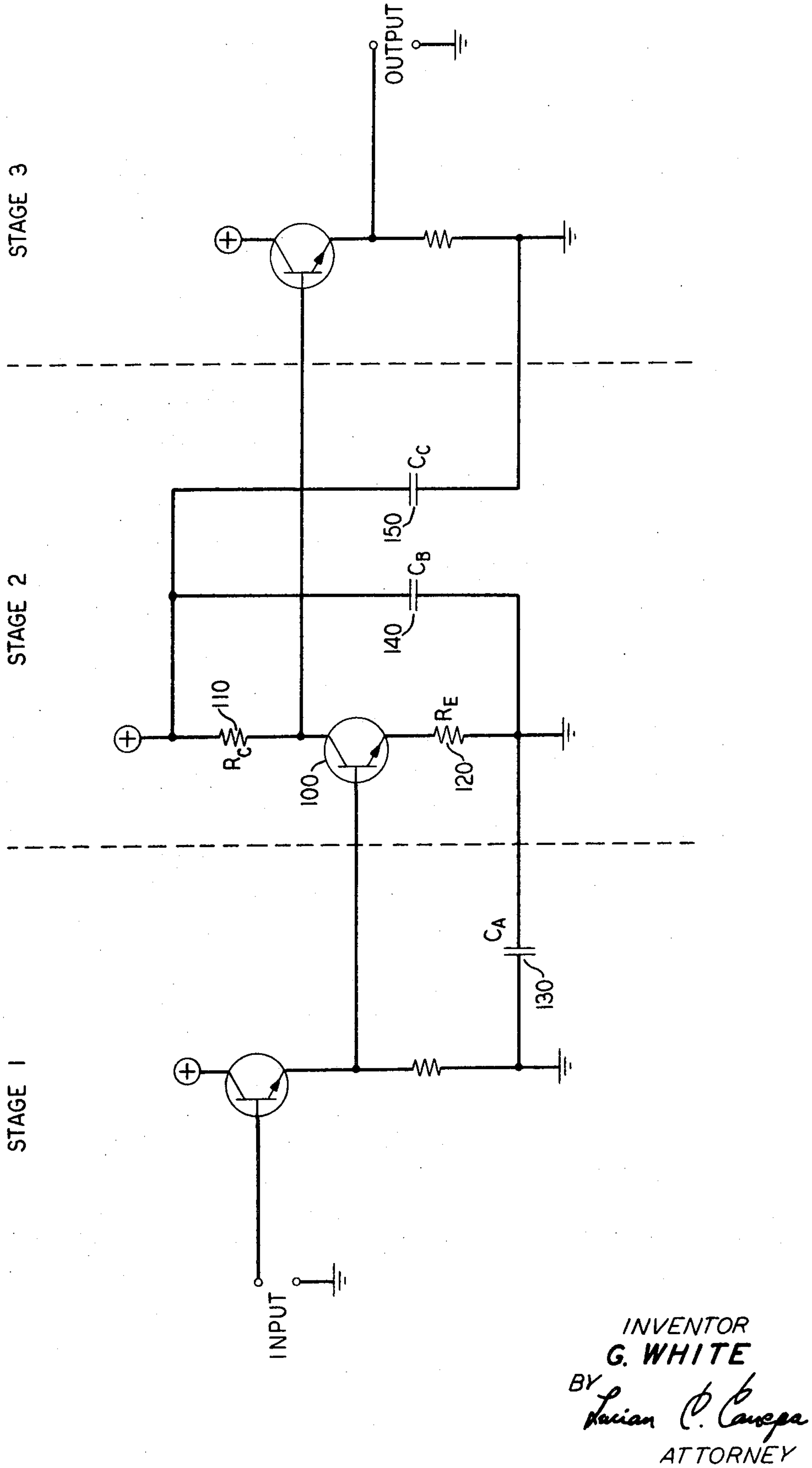
FIG. 1 (PRIOR ART)
FIG. 1 shows a basic prior art amplifier circuit.

FIG. 1 shows a basic common emitter high-frequency amplifier in accordance with the prior art. FIG. 1 may be more readily understood by considering that the arrangement depicted comprises three separate stages. Stages 1 and 3 are well-known emitter follower configurations. They are included only for purposes of isolating stage 2 from its input and its output. Typically, stages 1 and 3 provide near-unity voltage gain. Stage 2, on the other hand, is arranged to provide for a considerable voltage gain.

Stage 2 is seen to comprise a transistor 100 having a collector resistor 110($R_C$) and an emitter resistor 120($R_E$). The capacitors 130, 140 and 150($C_A$, $C_B$ and $C_C$, respectively) provide improved high-frequency gain and stability. Optimization of circuit parameters in the circuit of FIG. 1 for high-frequency performance leads to values of $R_C$ and $R_E$ of the order of 100 Ω and 40 Ω, respectively. These values of resistance are generally not compatible with a satisfactory definition of quiescent operating conditions required in amplifiers with d.c. amplification capabilities.

Figure 2:
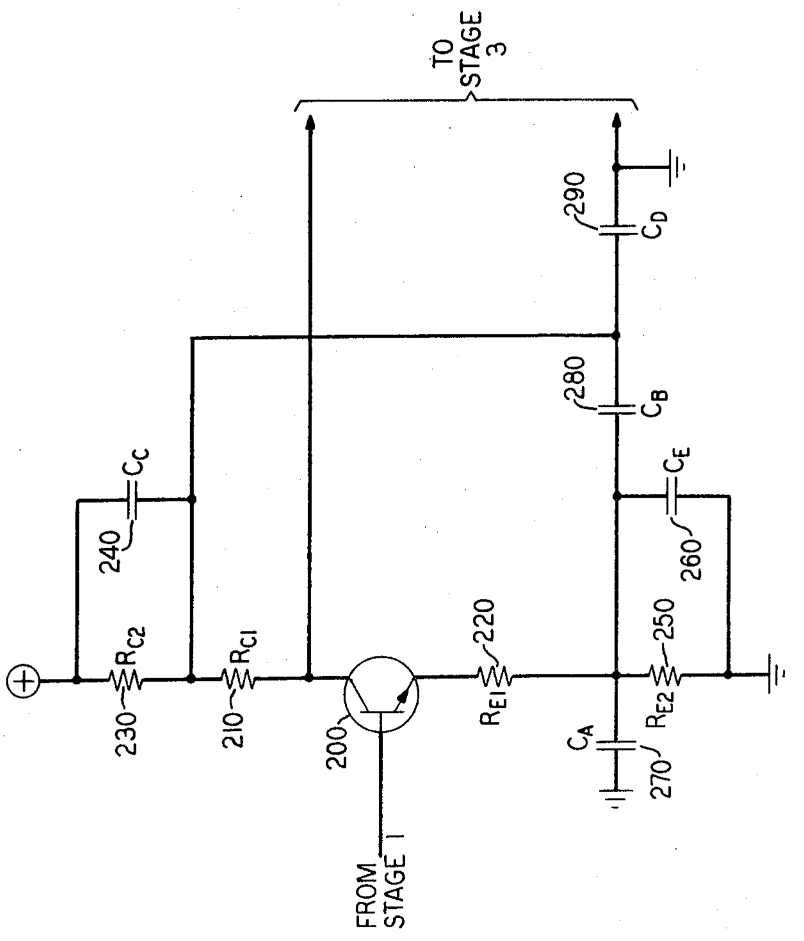
FIG. 2 shows modifications to the basic circuit of FIG. 1 in accordance with a preferred embodiment of the present invention.

FIG. 2 shows a modification of the circuit of FIG. 1. The circuit shown in FIG. 2 represents a preferred embodiment of the present invention. It should be noted that again there is provided a single high-gain stage typically buffered on either side by emitter follower stages (not shown). The buffer stages are again standard well-known circuits of the same type as are shown in FIG. 1. Stage 2, however, is considerably different.

The circuit of FIG. 2 is seen to include transistor 200, which is typically identical to transistor 100 in FIG. 1. Similarly, there is provided a first collector resistor 210($R_{C1}$) and a first emitter resistor 220($R_{E1}$). There are also provided parallel combinations of resistors and capacitors in each of the collector and emitter circuits. In particular, it is seen that there is included in the circuit of FIG. 2 a second collector resistor 230($R_{C2}$) connected in parallel with a collector capacitor 240($C_C$). Similarly, there is provided a second emitter resistor 250($R_{E2}$) and an emitter capacitor 260($C_E$). Again the capacitors $C_B$ and $C_D$, (designated 280 and 290, respectively) are present. $C_A$ is also to be considered as included in those cases where a stage 1 buffer of the type shown in FIG. 1 is included. The output of stage 2, as was the case for stage 2 in FIG. 1, is taken directly from the collector of the transistor 200 included in stage 2.

The arrangement shown in FIG. 2 may be conveniently regarded as an "embedding" of the high-frequency amplifier stage of FIG. 1 in a low-frequency amplifier. That is, the high-frequency amplifier is inserted in a low-frequency circuit without degrading the frequency-responsive characteristics of either. Thus, while prior art arrangements for high- and low-frequency amplifiers require a compromising of high-frequency parameter optimization to obtain satisfactory low-frequency performance, the circuit shown in FIG. 2 permits substantial optimization of high- and low-frequency performance simultaneously.

Specifically, in the circuit of FIG. 2, during the transmission of high-frequency signals, the resistors $R_{C2}$ and $R_{E2}$ are effectively short-circuited by capacitors $C_C$ and $C_E$, respectively, ($C_C$ and $C_E$ being characterized by a very low impedance at high frequency). Consequently, the gain of the circuit of FIG. 2 is determined essentially by $R_{C1}$ and $R_{E1}$ at high frequencies. Similarly, at low frequencies, capacitors $C_C$ and $C_E$ do not short circuit resistors $R_{E2}$ and $R_{C2}$ and the gain of the circuit of FIG. 2 is determined primarily by all the emitter and collector resistors, $R_{C1}$, $R_{C2}$, $R_{E1}$ and $R_{E2}$. Thus, it can be seen that by ensuring the equality $$R_{C1}/R_{E1} = (R_{C1}+R_{C2})/(R_{E1}+R_{E2}),$$

the gains for the amplifier in both the low-frequency and high-frequency portions of the spectrum become substantially equal.

Figure 3:
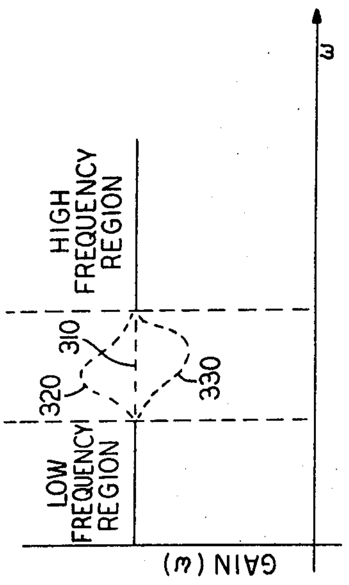
FIG. 3 shows a typical gain characteristic for the circuit of FIG. 2.

A resultant gain vs. frequency plot for the amplifier of FIG. 2 is shown by the graph in FIG. 3. It should be noted that the high-frequency portion remains essentially unchanged from the assumed characteristic for the amplifier of FIG. 1. Thus, what has been added by the circuit combination of FIG. 2 is a linear amplifier for signals in a low-frequency region as indicated on the chart in FIG. 3.

Figure 4:
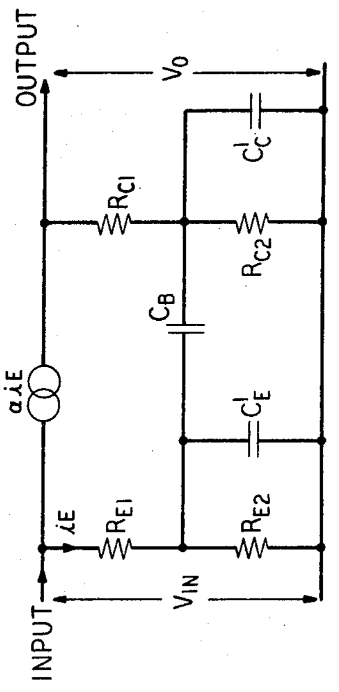
FIG. 4 shows the equivalent circuit for an operative portion of the circuit of FIG. 2.

The possible crossover modes from operation using essentially low-frequency components to that including the high-frequency components is shown by the broken lines in FIG. 3. The mid-frequency crossover variations can be more fully analyzed using the equivalent circuit of FIG. 4. The simplicity of this circuit results from the fact that the frequency of crossover is much less than the cutoff frequency of the transistor, so that a low-frequency model is permissible. The transfer function of this circuit is $$\frac{V_o}{V_{in}} = \frac{R_{C1}}{R_{E1}}\left[\frac{1+s\tau_C}{1+s\tau_E}\right]\left[\frac{[R_{C1}/R_{C2}(1+s\tau_C)+1]D-[sC_B R_{C2}(1+s\tau_E)+sC_B R_{E2}(1+s\tau_C)]}{[R_{C1}/R_{C1}(1+s\tau_E)+1]D-[sC_B R_{C2}(1+s\tau_E)+sC_B R_{E2}(1+s\tau_C)]}\right]$$

where $$D = (1+s\tau_C)(1+s\tau_E) + sR_{C2}(1+2\tau_E) + R_{E2}sC_B(1+S\tau_C)$$

$$s\tau_C = C_C' R_{C2}, \qquad C_C' = C_C + {}_{CD}$$

$$\tau_E = C_E' R_{E2}, \qquad C_E' = C_A + {}_{CE}$$

for $$R_{E1}/R_{C1} = (R_{E1}+R_{E2})/(R_{C1}+R_{C2}) \text{ and } \alpha \approx 1 .$$

It is clearly seen that by making $\tau_E = \tau_C$ the poles and zeros of the system cancel, thus producing a flat crossover. The value of $C_B$ is seen to be substantially unimportant. However, inordinately large values of $C_B$ will produce a dominant pole and zero combination which will tend to mask the required equality of $\tau_C$ and $\tau_E$. (As a practical matter values of $C_B$ much in excess of 1,000 picofarads are generally to be avoided.)

Typical parameter values for the various circuit elements of the circuit shown in FIG. 2 are the following:

Transistor 200: $f_T$ (high frequency cutoff) = 3 GHz

Resistors (in ohms):

| | |
|---|---|
| 210 – | 100 |
| 220 – | 40 |
| 230 – | 2500 |
| 250 – | 1000 |

Capacitors (in picofarads):

| | |
|---|---|
| 240 – | 290 |
| 260 – | 900 |
| 270 – | 100 |
| 280 – | 1000 |
| 290 – | 100 |

Figure 5:
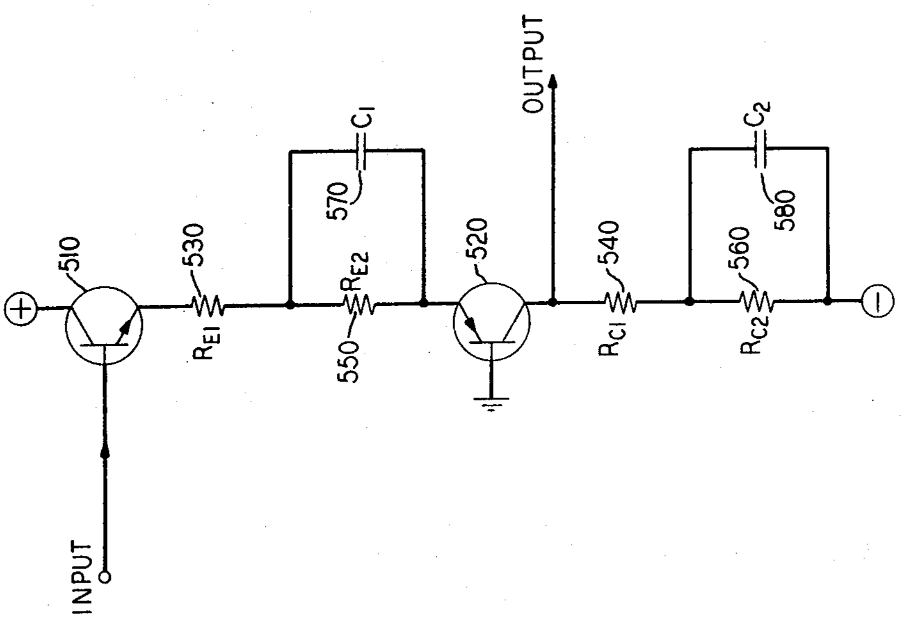
FIG. 5 shows a first alternate embodiment of the present invention in the form of a modified cascode amplifier stage.

FIG. 5 shows an alternate embodiment of the present invention. In this alternate embodiment there is provided a combination of two transistors 510 and 520, connected in the well-known cascode arrangement. Also shown are resistors 530 and 540 ($R_{E1}$ and $R_{C1}$, respectively) which are well-known components in typical cascode circuits. Also included are resistors 550($R_{E2}$) and 560($R_{C2}$) connected in parallel with respective capacitors 570($C_1$) and 580($C_2$). To achieve the desired flat broadband gain, the resistors are again chosen in accordance with the relationship $$R_{E1}/R_{C1} = (R_{E1}+R_{E2})/(R_{C1}+R_{C2})$$

The desired flat crossover (midband) characteristic is achieved by choosing the capacitor and resistor values in accordance with the relations, $$R_{C1}/R_{E1} = (R_{C1}+R_{C2})/(R_{E1}+R_{E2})$$

and $$R_{E2}C_1 = R_{C2}C_2.$$

Typical parameter values for the circuit of FIG. 5 are:

Transistors:

510 - NPN }
520-PNP } $f_T$ = 3GHz

Resistors (in ohms):

| | |
|---|---|
| 530 – | 40 |
| 540 – | 100 |
| 550 – | 1000 |
| 560 – | 2500 |

Capacitors (in picofarads):

| | |
|---|---|
| 570 – | 1000 |
| 580 – | 390 |

Figure 6:
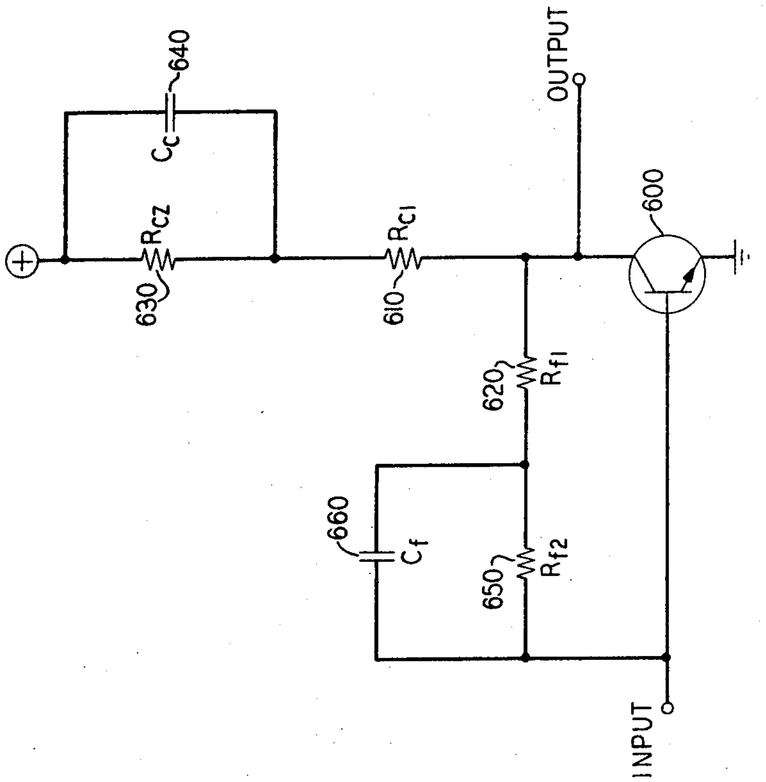
FIG. 6 shows a second alternate embodiment of the present invention embodied in a shunt feedback amplifier stage.

FIG. 6 shows yet another alternate embodiment of the present invention. Again the principles of adding parallel combinations of resistors and capacitors provide for the desired improved performance. Thus there is included in the circuit of FIG. 6 a transistor 600 connected in accordance with the shunt-feedback amplifier arrangement. For this purpose there are included resistors 610($R_{C1}$) and 620($R_{f1}$) connected in circuit paths from the collector to the power supply and the base respectively. Resistor 620 thus provides the feedback path typical of shunt-feedback amplifier stages. Again there is provided a resistor-capacitor combination, including resistor 630($R_{C2}$) and capacitor 640($C_C$) in the collector circuit. Another parallel combination of resistor 650($R_{f2}$) and capacitor 660($C_f$) is included. In this case, however, the latter parallel combination is included in the feedback path from collector to base. The governing relationships between the various parameters in the circuit of FIG. 6, to achieve the desired results in accordance with the present invention, are:

$$R_{C1}/R_{f1} = (R_{C1} + R_{C2})/(R_{f1} + R_{f2})$$

and $$R_{C2}C_C = R_{f2}C_f.$$

Typical parameter values for the circuit of FIG. 6 are:

Transistor 600: NPN, $f_T$ = 3GHz
Resistors (in ohms):
610 - 40
620 - 100
630 - 1000
650 - 2500

Capacitors (in picofarads):
640 - 1000
660 - 390

The above-described embodiments of the present invention should be considered merely typical. The described technique of imbedding a high-frequency amplifier in what previously has been regarded as a low-frequency circuit to achieve broadband amplification is applicable to many other circuit arrangements. Thus numerous and other varied embodiments of the present invention will occur to those skilled in the amplifier arts.

What is claimed is:

1. A circuit for amplifying with substantially equal gain signals extending over a range including low-frequency, mid-frequency and high-frequency signal components comprising a source of bias potential, a source of reference potential, a first collector resistor, $R_{C1}$, connected in a circuit path between said collector and said source of bias potential, a first emitter resistor, $R_{E1}$, connected in a circuit path between said emitter and said source of reference potential, a first parallel combination connected between said first collector resistor and said source of bias potential, said first parallel combination comprising a collector capacitor, $C_C$, and a second collector resistor, $R_{C2}$, connected in parallel with each other, and a second parallel combination connected between said first emitter resistor and said source of reference potential, said second parallel combination comprising an emitter capacitor, $C_E$, and a second emitter resistor, $R_{E2}$.

2. The circuit of claim 1 wherein said resistor parameter values are related in accordance with $$R_{C1}/R_{E1} = (R_{C1} + R_{C2})/(R_{E1} + R_{E2}).$$

3. The circuit of claim 2 further comprising a buffer input stage having one terminal connected to said source of reference potential, a capacitor, $C_A$, connected between said terminal of said input stage and the junction of $R_{E1}$ and said second parallel combination, a buffer output stage having one terminal connected to said source of reference potential, a capacitor, $C_D$, connected between said terminal of said output stage and the junction of $R_{C1}$ and said first parallel combination, and where $$\tau'_C = \tau_E$$

$$\tau_C = C'_C R_{C2}, , \tau_E = C'_E R_{E2}, C'_C = C_C + C_D, \text{ and}$$

$$C'_E = C_E + C_A.$$

4. A circuit for amplifying with substantially equal gain signals extending over a range including low-frequency, mid-frequency and high-frequency signal components comprising first and second bias sources, first and second transistors each having a base, collector and emitter, a first resistor, $R_{E1}$, connected in a circuit path between said emitter of said first transistor and said emitter of said second transistor, a second resistor, $R_{C1}$, connected in a circuit path between said collector of said second transistor and said second bias source, means connecting said collector of said first transistor to said first bias source, a first parallel combination connected between $R_{E1}$ and said emitter of said second transistor, said first parallel combination comprising a first capacitor, $C_1$, and a second emitter resistor, $R_{E2}$, connected in parallel with each other, a second parallel combination connected between $R_{C1}$ and said second bias source, said second parallel combination comprising a second capacitor, $C_2$, and a second collector resistor, $R_{C2}$, connected in parallel with each other, and wherein $$R_{C1}/R_{E1} = (R_{C1} + R_{C2})/(R_{E1} + R_{E2})$$

where $$\tau'_C = \tau_E$$

$$\tau_C = R_{C2}C_2, \tau_E = R_{E1}C_1.$$

5. A circuit for amplifying with substantially equal gain signals extending over a range including low-frequency, mid-frequency and high-frequency signal components comprising a transistor having a base, collector and emitter, a source of bias potential, a source of reference potential, a first collector resistor, $R_{C1}$, connected in a circuit path between said collector and said source of bias potential, a first feedback resistor, $R_{f1}$, connected in a circuit path between said collector and said base, a first parallel combination connected between $R_{C1}$ and said source of bias potential, said first parallel combination comprising a collector resistor, $R_{C2}$, and a collector capacitor, $C_C$, a second parallel combination connected between $R_{f1}$ and said base, said second parallel combination comprising a second feedback resistor, $R_{f2}$, and a feedback capacitor, $C_f$, and where $$R_{C1}/R_{f1} = (R_{C1} + R_{C2})/(R_{f1} + R_{f2})$$

where $\tau_C = \tau_f$ $\tau_C = R_{C2}C_C$ $\tau_f = R_{f2}C_f.$

* * * * *